US009476144B2

(12) United States Patent
Sanchez et al.

(10) Patent No.: US 9,476,144 B2
(45) Date of Patent: *Oct. 25, 2016

(54) METHOD AND APPARATUS FOR THE SELECTIVE DEPOSITION OF EPITAXIAL GERMANIUM STRESSOR ALLOYS

(75) Inventors: Errol Antonio C. Sanchez, Tracy, CA (US); David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 936 days.

This patent is subject to a terminal disclaimer.

(21) Appl. No.: 13/193,506

(22) Filed: Jul. 28, 2011

(65) Prior Publication Data

US 2012/0247386 A1   Oct. 4, 2012

Related U.S. Application Data

(60) Provisional application No. 61/468,443, filed on Mar. 28, 2011.

(51) Int. Cl.
| | |
|---|---|
| C30B 25/02 | (2006.01) |
| C30B 29/52 | (2006.01) |
| C30B 25/14 | (2006.01) |
| C30B 25/16 | (2006.01) |
| C30B 23/02 | (2006.01) |
| C30B 23/06 | (2006.01) |
| C30B 29/08 | (2006.01) |

(52) U.S. Cl.
CPC .............. C30B 29/52 (2013.01); C30B 25/14 (2013.01); C30B 25/16 (2013.01); C30B 23/02 (2013.01); C30B 23/06 (2013.01); C30B 23/066 (2013.01); C30B 29/08 (2013.01)

(58) Field of Classification Search
CPC ............................... C30B 25/14; C30B 25/16
USPC .......................................................... 117/99
See application file for complete search history.

(56) References Cited

U.S. PATENT DOCUMENTS

| | | | |
|---|---|---|---|
| 2,742,383 | A | 4/1956 | Barnes et al. |
| 5,548,128 | A | 8/1996 | Soref et al. |
| 7,470,972 | B2 | 12/2008 | Kavalieros et al. |

(Continued)

FOREIGN PATENT DOCUMENTS

| | | |
|---|---|---|
| CN | 101831629 A | 9/2010 |
| JP | 7331446 A | 12/1995 |

OTHER PUBLICATIONS

International Search Report and Written Opinion in International Application No. PCT/US11/045795 mailed Mar. 20, 2012.

(Continued)

*Primary Examiner* — Michael Kornakov
*Assistant Examiner* — Hua Qi
(74) *Attorney, Agent, or Firm* — Patterson & Sheridan, LLP

(57) ABSTRACT

A method and apparatus for forming heterojunction stressor layers is described. A germanium precursor and a metal precursor are provided to a chamber, and an epitaxial layer of germanium-metal alloy formed on the substrate. The metal precursor is typically a metal halide, which may be provided by subliming a solid metal halide or by contacting a pure metal with a halogen gas. The precursors may be provided through a showerhead or through a side entry point, and an exhaust system coupled to the chamber may be separately heated to manage condensation of exhaust components.

19 Claims, 3 Drawing Sheets

(56) References Cited

U.S. PATENT DOCUMENTS

| | | |
|---|---|---|
| 2004/0129212 A1 | 7/2004 | Gadgil et al. |
| 2007/0020891 A1 | 1/2007 | Kouvetakis et al. |
| 2008/0187768 A1* | 8/2008 | Kouvetakis ......... C23C 16/0272 428/450 |
| 2009/0087967 A1* | 4/2009 | Todd ................. H01L 21/02529 438/507 |
| 2009/0111246 A1* | 4/2009 | Bauer .................... C23C 16/04 438/478 |
| 2009/0136652 A1 | 5/2009 | Washington et al. |
| 2009/0250641 A1* | 10/2009 | Moriya .............. G03F 7/70033 250/504 R |
| 2010/0168493 A1* | 7/2010 | Le Peltier .............. C10G 35/09 585/660 |

OTHER PUBLICATIONS

Search Report and Office Action for Chinese Application No. 201180069589.5 dated Mar. 8, 2016.

Barrio, et al., "Model of the Electronic Structure of Amorphous Germanium Tin Alloys," Solid State Communications, vol. 74, No. 2, 1990, pp. 103-108.

Liow, et al., "Germanium Source and Drain Stressors for Ultrathin-Body and Nanowire Field-Effect Transistors," IEEE Electron Device Letters, vol. 29, No. 7, Jul. 2008, pp. 808-810.

* cited by examiner though the invention may

METHOD AND APPARATUS FOR THE SELECTIVE DEPOSITION OF EPITAXIAL GERMANIUM STRESSOR ALLOYS

CROSS-REFERENCE TO RELATED APPLICATIONS

This application claims benefit of U.S. Provisional Patent Application Ser. No. 61/468,443 filed Mar. 28, 2011, which is herein incorporated by reference.

BACKGROUND OF THE INVENTION

1. Field of the Invention

Technology described herein relates to manufacture of semiconductor devices. More specifically, methods are described of forming field effect transistors using strained materials.

2. Description of the Related Art

Germanium was one of the first materials used for semiconductor applications such as CMOS transistors. Due to vast abundance of silicon compared to germanium, however, silicon has been the overwhelming semiconductor material of choice for CMOS manufacture. As device geometries decline according to Moore's Law, the size of transistor components poses challenges to engineers working to make devices that are smaller, faster, use less power, and generate less heat. For example, as the size of a transistor declines, the channel region of the transistor becomes smaller, and the electronic properties of the channel become less viable, with more resistivity and higher threshold voltages. Carrier mobility is increased in the silicon channel area by using silicon-germanium stressors embedded in the source/drain areas, as some manufacturers have done for the 45 nm node. For future nodes, however, still higher mobility devices are needed. Thus, there is a continuing need for methods and apparatus to form high mobility semiconductor devices.

SUMMARY OF THE INVENTION

Method and apparatus for forming stressor layers on a semiconductor substrate are provided. A germanium stressor layer may be formed on a substrate by positioning the substrate in a processing chamber, flowing a germanium precursor into the processing chamber, forming a stressor precursor outside the processing chamber, flowing the stressor precursor into the processing chamber, and growing the germanium stressor layer epitaxially on the substrate. An apparatus for forming such layers includes a rotating substrate support disposed in an enclosure, a plurality of gas inlets formed in a wall of the enclosure, a least one gas outlet formed in a wall of the enclosure, a reactive or non-reactive source for generating a stressor precursor coupled to a gas inlet by a first conduit, a non-reactive source for providing a germanium precursor coupled to a gas inlet by a second conduit, and a heated exhaust system. The heated exhaust system may have a coating applied to reduce adhesion of exhaust components, and may include a condensation trap.

The germanium precursor may be a hydride, and the stressor precursor may be a metal halide. A selectivity control species, for example a halide gas, may be included with the reaction mixture to control deposition selectivity on semiconductive and dielectric regions of the substrate.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
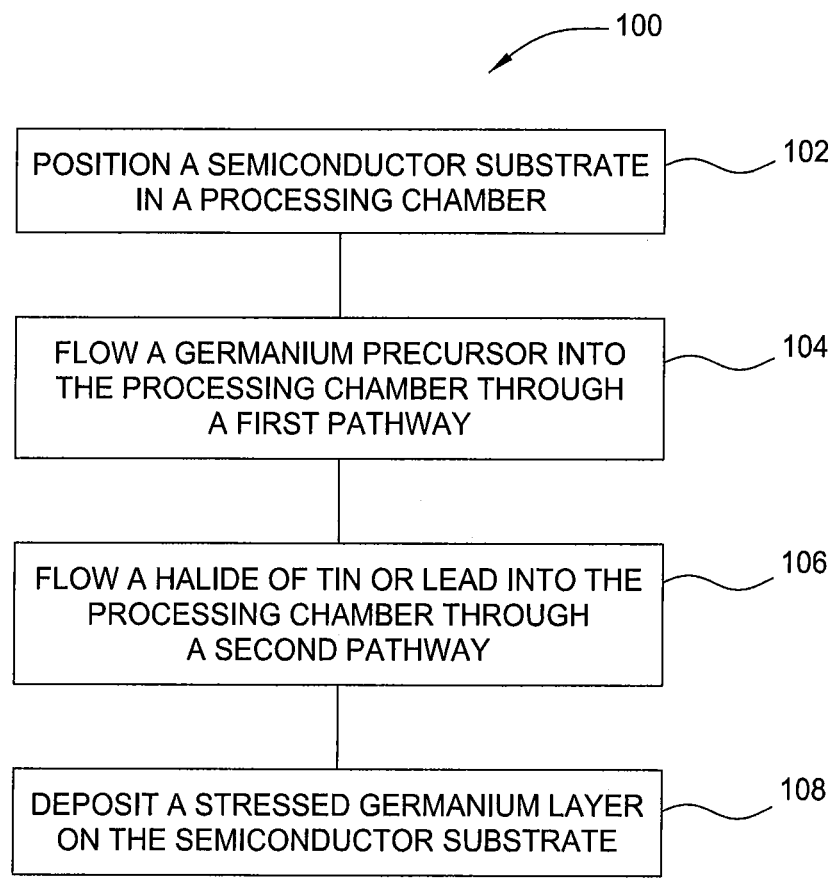
FIG. 1 is a flow diagram summarizing a method according to one embodiment.

FIG. 1 is a flow diagram summarizing a method 100 according to one embodiment. A semiconductor substrate is positioned in a processing chamber at 102. The semiconductor substrate may be any semiconductive material on which a stressor layer is to be formed. A silicon substrate on which a transistor structure is to be formed may be used in one example. The semiconductor substrate may have dielectric areas formed on a surface thereof in some embodiments. For example, a silicon substrate may have transistor gate structures and dielectric spacers formed adjacent to semiconductive source/drain regions, which may be regions of doped silicon or regions on which source/drain materials are to be formed. Thus, the source/drain regions may comprise the stressor layers described herein in addition to, or instead of, doped silicon layers.

The stressor layers described herein typically comprise metal atoms disposed in a germanium matrix, $Ge_xM_y$. Large metal atoms, for example group IV metals larger than germanium, such as tin and lead, are useful for adding compressive stress to a germanium matrix. A germanium crystal usually has a cubic structure with unit cell dimension about 570 pm. Each germanium atom has a radius of about 125 pm, which tin atoms have radius of about 145 pm, and lead has radius of between 155 and 180 pm. Adding the larger metal atoms to a germanium crystal matrix results in a larger lattice size that exerts a uniaxial compressive stress to lateral germanium atoms and/or biaxial tensile strain to overlying germanium atoms. Such strain increases the energy of local electrons and reduces the bandgap of the germanium, resulting in higher carrier mobility compared to unstrained germanium.

In one aspect, the silicon substrate may have a germanium channel layer adjacent to which the stressor layer is to be formed as part of a transistor gate structure. The $Ge_xM_y$ stressor in this case applies a uniaxial stress onto the neighboring germanium layer. In another aspect, the germanium channel layer is deposited over the stressor layer, so that a biaxial tensile strain is applied to the germanium channel layer.

A germanium precursor is provided to the processing chamber containing the semiconductor substrate at 104. The germanium precursor is typically a germanium hydride, such as germane ($GeH_4$), digermane ($Ge_2H_6$), or higher hydrides ($Ge_xH_{2x+2}$), or a combination thereof. The germanium precursor may be mixed with a carrier gas, which may be a non-reactive gas such as nitrogen gas, hydrogen gas, or a noble gas such as helium or argon, or a combination thereof. The ratio of germanium precursor volumetric flow rate to carrier gas flow rate may be used to control gas flow velocity through the chamber. The ratio may be any proportion from about 1% to about 99%, depending on the flow velocity desired. In some embodiments, a relatively high velocity may improve uniformity of the formed layer. In a 300 mm single-wafer embodiment, the flow rate of germanium precursor may be between about 0.1 sLm and about 2.0 sLm. For a chamber having a volume of about 50 L, at the above flow rates for germanium precursor, carrier gas flow rate between about 5 sLm and about 40 sLm provides a uniform layer thickness.

A metal halide is provided to the processing chamber at 106 to react with the germanium precursor and deposit a layer of metal doped germanium. The metal halide may be a tin or lead halide gas, for example $SnCl_4$, $SnCl_2$, $PbCl_4$, or $PbCl_2$ or an organometallic chloride having the formula $R_xMCl_y$, where R is methyl or t-butyl, x is 1 or 2, M is Sn or Pb, and y is 2 or 3, such that the formed layer is composed primarily of group IV elements.

The degree of mobility enhancement achieved in the neighboring germanium layer depends on the lattice mismatch and consequent stress imparted by the stressor layer. This in turn depends approximately linearly on the concentration of metal atoms in the stressor matrix. As the concentration of metal increases in the stressor, the energy of valence electrons in the neighboring stressed germanium rises due to bending and straining of orbitals, and the energy of the conduction band decreases. At high enough concentration, the semiconductor-metal alloy becomes a direct bandgap material (i.e. metallic). It may be useful, in some embodiments, to limit the metal concentration so the alloy remains an indirect bandgap material. In transistor applications, maintaining an indirect bandgap material in source/drain regions may reduce leakage.

The metal halide is provided to the processing chamber at a flow rate between about 10 sccm and about 300 sccm, such as between about 50 sccm and about 200 sccm, for example about 100 sccm. The metal halide may also be mixed with a carrier gas to achieve a desired space velocity and/or mixing performance in the processing chamber. The metal halide may be sourced from a solid source of metal halide crystals sublimed into a flowing carrier gas stream such as $N_2$, $H_2$, Ar, or He, or the metal halide may be generated by passing a halogen gas, optionally with one of the above carrier gases, over a solid metal in a contacting chamber to perform the reaction $M+2Cl_2\rightarrow MCl_4$, where M is Sn or Pb. The contacting chamber may be adjacent to the processing chamber, coupled thereto by a conduit which is preferably short to reduce the possibility of metal halide particles depositing in the conduit.

The metal halide and the germanium precursor are usually provided to the processing chamber through different pathways. The germanium precursor is provided through a first pathway, and the metal halide is provided through a second pathway. The two pathways are generally different and kept separate up to the point of entry into the processing chamber. In one embodiment, both streams enter through a side wall of the chamber proximate an edge of the substrate support, travel across the substrate support from one side to an opposite side thereof and into an exhaust system. The substrate support may rotate during formation of the stressed layer to improve uniformity. The first pathway generally communicates with a first entry point into the processing chamber, which may comprise one or more openings in a wall of the chamber or a gas distributor, such as a showerhead, coupled to a wall of the chamber. The one or more openings may be proximate an edge of the substrate support, as described above, or may be portals in a dual or multi path gas distributor. The second pathway likewise communicates with a second entry point similar to the first entry point. The first and second entry points are disposed such that the two streams mix and provide a deposition or layer growth mixture in a region above the substrate support. Use of a gas distributor may reduce or eliminate the need to rotate the substrate during processing in some embodiments.

Growth of the stressor layer is generally epitaxial for high structural quality. Pressure in the processing chamber is maintained between about 5 Torr and about 200 Torr, such as between about 20 Torr and about 80 Torr, for example about 40 Torr. Temperature is between about 150° C. and about 500° C., such as between about 200° C. and about 400° C., for example about 300° C. Temperatures are kept below a decomposition temperature of the metal halide precursor, generally about 600° C. or lower. Pressures may be below about 5 Torr in some embodiments, but reduced pressure also reduces deposition rate. Deposition rate at these conditions is between about 50 Å/min and about 500 Å/min.

A germanium stressor layer, or germanium metal alloy layer, is formed at 108, according to the following reactions:

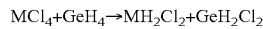

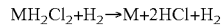

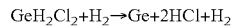

where M is Sn or Pb. Similar reactions occur with the organometallic chlorides described above. Higher order germanes yield a mix of chlorogermane intermediates, which similarly resolve into germanium deposits. Hydrogen gas may be provided to the chamber to facilitate the deposition reactions. A flowrate of hydrogen gas between about 5 sLm and about 40 sLm may be included with any or all of the precursors to provide an ambient hydrogen concentration.

The layer is typically deposited to a thickness between about 300 Å and about 800 Å. Concentration of tin atoms in a germanium matrix may be between about 1% and about 12%, such as between about 3% and about 9%, for example about 6%, according to the method 100. If lead is used, concentration of lead atoms in the germanium matrix may be between about 0.2% and about 5%, such as between about 1% and about 3%, for example about 2%. A mixture of lead and tin may be used, if desired. Lead may achieve higher bandgap reduction at lower doses than tin, and using a mixture of lead and tin may be advantageous in some embodiments for delivering processability (i.e. tin halides are more stable than lead halides at elevated temperatures) with some enhancement of bandgap reduction.

Figure 2:
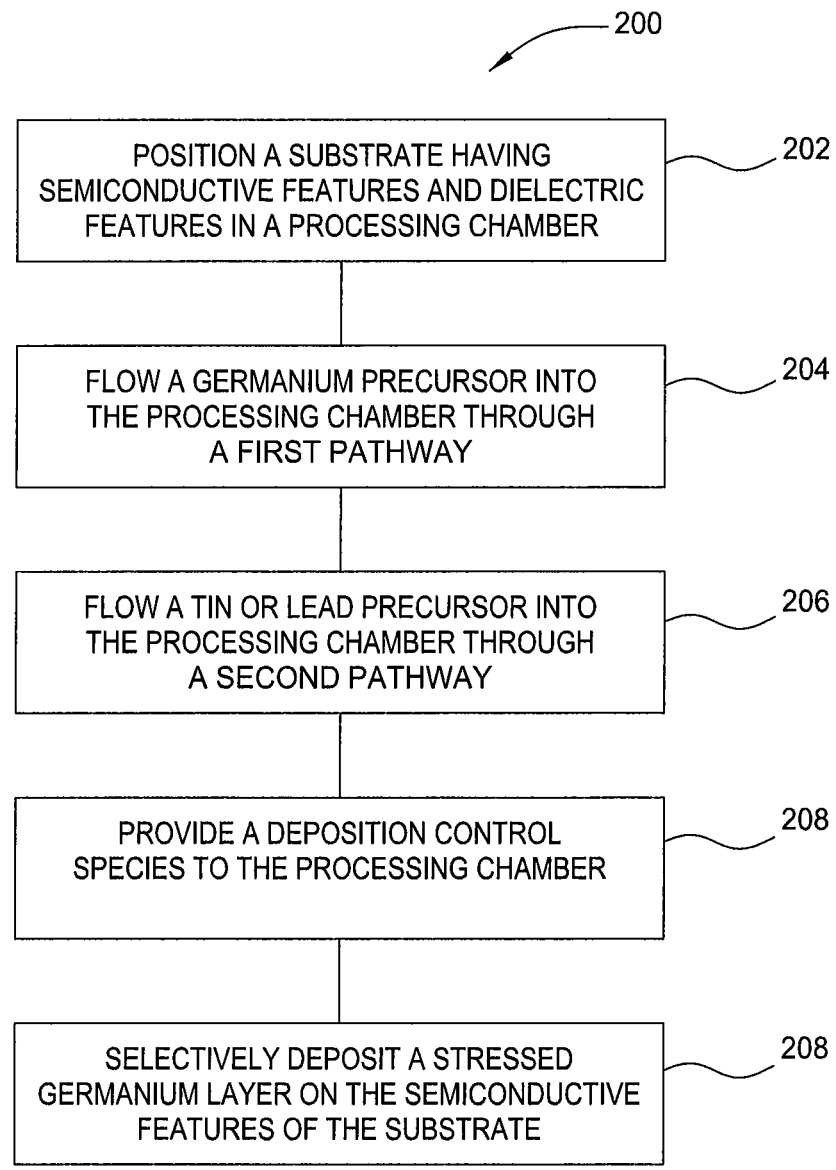
FIG. 2 is a flow diagram summarizing a method according to another embodiment.

FIG. 2 is a flow diagram summarizing a method 200 according to another embodiment. The method 200 is similar in many respects to the method 100, and may be used to achieve similar results when processing substrates having semiconductive and dielectric regions. At 202, a substrate having semiconductive and dielectric features is disposed in a processing chamber with characteristics as described above in connection with FIG. 1. At 204, a germanium precursor, which may be any of the germanium precursors described in connection with FIG. 1, is provided to the processing chamber through a first pathway. At 206, a tin or lead precursor, or a mixture of tin and lead precursors, which may be any of the tin or lead precursors described above in connection with FIG. 1, is provided to the processing chamber through a second pathway.

At 208, a deposition control species is provided to the processing chamber. The deposition control species is provided to control deposition of germanium, tin, and/or lead on the surface of the substrate. The deposition control species selectively removes deposited species from the dielectric regions of the substrate faster than from the semiconductive regions. Thus, the deposition control species may be a selectivity control species because in some embodiments selectivity may be controlled by adjusting the amount of the selectivity control species relative to the reactive species in the reaction mixture.

The deposition control species is typically a halogen containing species, such as a halide, for example HCl, HF, or HBr. In one embodiment, the deposition control species is HCl. The deposition control species may be provided at a flow rate between about 10 sccm and about 1000 sccm, such as between about 100 sccm and about 500 sccm, for example about 200 sccm. Layer growth selectivity and deposition rate may be controlled by adjusting a volumetric ratio of deposition control species to germanium precursor. A higher ratio reduces deposition rate overall, but improves selectivity. The volumetric flow ratio of deposition control species to germanium precursor ranges between about 0.01 and about 0.1 for most embodiments, such as between about 0.02 and about 0.06, for example about 0.04. At the upper end of the range the deposition rate is about 50 Å/min, while at the low end of the range the deposition rate is about 500 Å/min. However, at the upper end of the range, film growth on dielectric regions of the substrate is not observed, while at the lower end of the range, the deposition rate on the semiconductive regions is about 50 times the deposition rate on the dielectric regions.

The amount of compressive stress introduced by the stressor layer may be controlled at low metal concentrations by varying the concentration of metal incorporated in the stressor matrix. The metal concentration may be controlled by adjusting a ratio of metal precursor to germanium precursor in the reaction mixture. For most embodiments, the ratio of volumetric flow rates of metal precursor to germanium precursor provided to the processing chamber will be between about 1% and about 20%, such as between about 4% and about 12%, for example about 8%.

Figure 3:
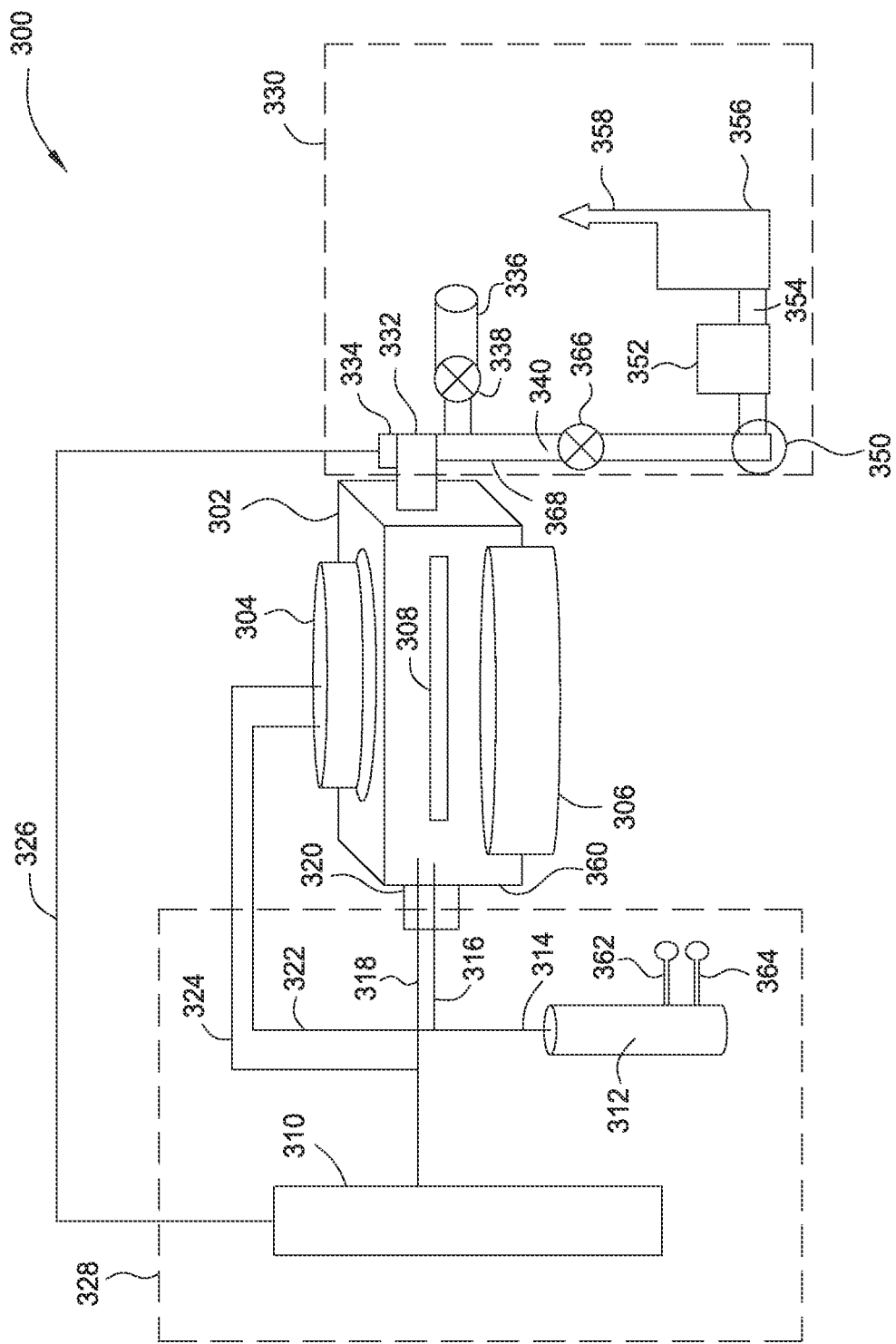
FIG. 3 is a schematic diagram of an apparatus according to another embodiment.

FIG. 3 is a schematic diagram of an apparatus 300 according to another embodiment. The apparatus 300 is useable for practicing the methods described herein for forming stressed layers. A processing chamber 302 has a substrate support 308, which may be a rotating substrate support, disposed in an interior thereof. A heat source 306 is disposed facing one side of the substrate support 308. Alternately, a heat source may be embedded in the substrate support 308. A chamber with a heated substrate support as described in commonly assigned U.S. Pat. No. 7,172,792, entitled "Method for forming a high quality low temperature silicon nitride film", issued Feb. 6, 2007, may be adapted to build the apparatus described herein and to practice the methods described herein. A chamber with a lamp heating module as described in commonly assigned U.S. Patent Publication 2008/0072820, entitled "Modular CVD Epi 300 mm Reactor", published Mar. 27, 2008, may also be adapted to build the apparatus described herein and to practice the methods described herein. An Epi™ 300 mm reactor or a 300 mm xGen™ chamber, both available from Applied Materials, Inc., of Santa Clara, Calif., may be adapted to make and use embodiments described herein. The processing chamber 302 may have a showerhead 304 for gas entry into the chamber. Alternately, gas may be provided to the processing chamber through a side entry 320 coupled to a side wall 360 of the chamber 302.

A feed system 328, including a chemical delivery system 310 and a metal precursor contact chamber 312, is coupled to the chamber 302 through a variety of conduits. A first conduit 322 and a second conduit 324 may couple the feed system 328 to the optional showerhead 304. For performing the methods described herein, the showerhead 304 may be a dual-pathway showerhead to prevent mixing of the precursors prior to entry into the chamber 302. An exemplary dual-pathway showerhead is described in commonly assigned U.S. Pat. No. 6,983,892, entitled "Gas distribution showerhead for semiconductor processing", issued Jan. 10, 2006.

Alternately, or additionally, cross-flow gas injection may be practiced by providing first and second cross-flow gas conduits 316 and 318 to the side entry point 320. An example of a cross-flow injection configuration is described in U.S. Pat. No. 6,500,734. The apparatus 300 may contain both a showerhead configuration and a cross-flow injection configuration, or only one or the other configuration.

The chemical delivery system 310 delivers germanium precursors, optionally with carrier gases such as nitrogen and/or hydrogen, to the chamber 302. The chemical delivery system 310 may also delivery depositon or selectivity control species to the chamber 302. The chemical delivery system 310 may include liquid or gaseous sources and controls (not shown), which may be configured in a gas panel.

The contact chamber 312 may be coupled to either the side entry point 320 or the showerhead 304 by a conduit 314 disposed to carry a metal precursor to the chamber 302. Conduits 314, 316, and 322 may be heated to a temperature between about 50° C. and about 200° C. to control or prevent condensation of metal halide species therein. The contact chamber 312 typically contains a bed of solid metal or metal halide crystals. The metal halide crystals may be sublimed into a carrier gas provided through one or both of the gas feed conduits 362 and 364. The solid metal may be contacted with a halogen gas source provided through one or both of the gas feed conduits 362 and 364. In one embodiment, a halogen gas source is provided through a first gas feed conduit 362 while a carrier gas is provided through a second gas feed conduit 364. The gases, either for subliming or reacting, may be flowed through a powdered metal or metal halide fluidized bed to enhance contacting. A mesh strainer or filter may be used to prevent entrainment of particles into the chamber 302. Alternately, the gases may flow across a fixed solid metal or metal halide bed.

An exhaust system 330 is coupled to the chamber 302. The exhaust system 330 may be coupled to the chamber at any convenient location, which may depend on the location of the gas entry into the chamber. For gas entry through the showerhead 304, the exhaust system may be coupled to a bottom wall of the chamber, around the heat source 306, for example, by one or more portals or through an annular opening. An annular manifold may be disposed near an edge of the substrate support and coupled to the exhaust system 330 in some embodiments. For cross-flow embodiments, the exhaust system 330 may be coupled to a side wall of the chamber opposite the side entry point 320.

An exhaust conduit 340 couples an exhaust cap 332 to a vacuum pump 352 through a throttle valve 366. A jacket 368 encompasses the exhaust conduit 340 and throttle valve 366 from the exhaust cap 332 to an inlet 350 of the vacuum pump 352. The jacket 368 enables thermal control of the exhaust conduit 340 to prevent condensation of exhaust species in the line. Any heating medium, such as steam, or hot air, water, or other hot fluid, may be used to maintain the exhaust conduit at a temperature above a dew point of the exhaust gas. Alternately, the jacket may include resistive heating elements (i.e. an electric blanket). A condensation trap 336 may be coupled to the exhaust conduit 340 by a valve 338, if desired, to further enhance trapping of any condensates in the exhaust system 330. The vacuum pump 352 pays off to an abatement system 356 through an abatement conduit 354, which is typically not heated or jacketed, and cleaned gas exhausted at 358. To further reduce wetting or nucleation in the exhaust conduit 340, the exhaust conduit 340 may be coated with quartz or with an inert polymer material.

Plasma or ultraviolet activated cleaning agents may be coupled into the exhaust system 330 by active source 334, which may be coupled to a microwave or RF chamber for generating active cleaning species. A cleaning gas line 326 may provide cleaning gases from the chemical delivery system 310 to the exhaust conduit 340, proceeding through the active source 334, if desired. Use of active species for cleaning allows cleaning to proceed at reduced temperatures.

A method for cleaning a chamber used to perform the methods described herein, such as the chamber 302, or any chamber used to perform the methods 100 and 200, includes providing a halogen gas to the chamber, converting residues to volatile halides. Temperature of the chamber is typically maintained below about 600° C. during cleaning, and metal deposits are converted to $MCl_x$, typically $SnCl_x$ or $PbCl_x$. The halogen gas may be chlorine gas, fluorine gas, HCl, or HF. The chamber may be heated to an extent that separate heating of the exhaust conduit is not needed, especially if the exhaust conduit is insulated. Alternately, chamber temperature may be kept below about 400° C., if desired, and the exhaust conduit 340 heated to prevent condensation.

Alternate embodiments of forming a stressor layer may include cyclical processes of forming a substantially pure epitaxial germanium layer and then forming a metal-doped epitaxial germanium layer, the pure and doped layers formed by starting and stopping flow of the metal precursor while maintaining flow of the germanium precursor, generally according to recipes described above. In other embodiments, a layer having graded stress may be formed by establishing flow of the germanium precursor for a period of time to form an epitaxial initial layer of substantially pure germanium, starting flow of the metal precursor at an initial flow rate, and then increasing the flow rate of the metal precursor to a final flow rate according to any desired pattern, linear or non-linear. Such a graded stress layer may adhere to underlying layers more strongly while providing increased electron mobility.

While the foregoing is directed to embodiments of the invention, other and further embodiments of the invention may be devised without departing from the basic scope thereof.

What is claimed is:

1. A method of processing a substrate, comprising:
   positioning the substrate in a processing chamber;
   flowing a germanium precursor into the processing chamber;
   forming a metal halide stressor precursor in a contact chamber coupled to the processing chamber, wherein the metal halide stressor precursor comprises chlorine or fluorine, and wherein the forming the metal halide stressor precursor comprises subliming a solid source of metal halide crystals into a flowing carrier gas stream comprising $N_2$, $H_2$, Ar, or He;
   flowing the metal halide stressor precursor into the processing chamber; and growing a germanium stressor layer epitaxially on the substrate, wherein the germanium stressor layer comprises metal atoms disposed in a germanium matrix with a resulting metal atom concentration in the germanium stressor layer of between about 1% and about 12%, wherein the metal atoms are from the metal halide stressor precursor.

2. The method of claim 1, further comprising flowing a selectivity control species into the processing chamber.

3. The method of claim 2, wherein the substrate comprises dielectric regions and semiconductive regions, and the selectivity control species controls relative growth rate of the germanium stressor layer on the dielectric and semiconductive regions.

4. The method of claim 3, wherein the selectivity control species selectively removes material deposited on the dielectric regions of the substrate.

5. The method of claim 2, wherein the growing the germanium stressor layer epitaxially on the substrate comprises maintaining the processing chamber at a pressure between about 5 Torr and about 80 Torr and a temperature between about 150° C. and about 400° C.

6. The method of claim 5, wherein a flow rate ratio of the metal halide stressor precursor to the selectivity control species is between about 2:1 and about 100:1.

7. The method of claim 1, wherein the metal halide stressor precursor comprises organotin chlorides having the general formula $R_xSnCl_y$, wherein R is methyl or t-butyl, x is 1 or 2, and y is 2 or 3.

8. The method of claim 1, wherein the germanium precursor is germane or digermane, and the metal halide stressor precursor is an organotin chloride.

9. The method of claim 1, wherein the germanium precursor and the metal halide stressor precursor flow across the processing chamber from one side of the processing chamber to an opposite side of the processing chamber.

10. The method of claim 1, wherein the germanium precursor and the metal halide stressor precursor flow into the processing chamber through a showerhead.

11. A method of processing a substrate, comprising:
    positioning the substrate in a processing chamber;
    flowing a first gas comprising a germanium hydride into the processing chamber; forming a metal halide stressor precursor in a contact chamber coupled to the processing chamber, wherein the forming the metal halide stressor precursor comprises subliming a solid source of metal halide crystals into a flowing a carrier gas stream comprising $N_2$, $H_2$, Ar, or He in the contact chamber, wherein the metal halide stressor precursor comprises chlorine or fluorine;
    flowing a second gas comprising the metal halide stressor precursor into the processing chamber; and
    growing a germanium stressor layer epitaxially on the substrate, wherein the germanium stressor layer comprises metal atoms disposed in a germanium matrix with a resulting metal atom concentration in the germanium stressor layer of between about 1% and about 12%, wherein the metal atoms are from the metal halide stressor precursor.

12. The method of claim 11, wherein the metal halide stressor precursor comprises an organotin chloride.

13. The method of claim 12, further comprising flowing a selectivity control species into the processing chamber.

14. The method of claim 13, wherein a flow rate ratio of the metal halide stressor precursor to the selectivity control species is between about 2:1 and about 100:1.

15. The method of claim 13, wherein the organotin chloride has the general formula $R_xSnCl_y$, wherein R is methyl or t-butyl, x is 1 or 2, and y is 2 or 3.

16. The method of claim 13, wherein the growing the germanium stressor layer epitaxially on the substrate comprises maintaining the processing chamber at a pressure between about 5 Torr and about 80 Torr and a temperature between about 150° C. and about 400° C.

17. A method of processing a substrate, comprising:
positioning the substrate in a processing chamber;
flowing a first gas comprising a germanium hydride into the processing chamber;
forming an organotin chloride in a contact chamber coupled to the processing chamber, wherein the organotin chloride has the general formula $R_xSnCl_y$, wherein R is methyl or t-butyl, x is 1 or 2, and y is 2 or 3 wherein the forming the organotin chloride comprises subliming a solid source of metal halide crystals into a flowing carrier gas stream comprising $N_2$, $H_2$, Ar, or He;
flowing a second gas comprising a stressor precursor into the processing chamber;
flowing a selectivity control species into the processing chamber; and growing a germanium stressor layer epitaxially on the substrate, wherein the germanium stressor layer comprises metal atoms disposed in a germanium matrix with a resulting metal atom concentration in the germanium stressor layer of between about 1% and about 12%, wherein the metal atoms are from the organotin chloride.

18. The method of claim 17, wherein the selectivity control species is a halide gas.

19. The method of claim 18, wherein the germanium hydride, the organotin chloride, and the halide gas flow across the processing chamber from one side of the processing chamber to an opposite side of the processing chamber.

* * * * *